(12) United States Patent
Kotani

(10) Patent No.: US 9,024,358 B2
(45) Date of Patent: May 5, 2015

(54) COMPOUND SEMICONDUCTOR DEVICE WITH EMBEDDED ELECTRODE CONTROLLING A POTENTIAL OF THE BUFFER LAYER

(71) Applicant: Fujitsu Limited, Kawasaki-shi, Kanagawa (JP)

(72) Inventor: Junji Kotani, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/732,596

(22) Filed: Jan. 2, 2013

(65) Prior Publication Data
US 2013/0257539 A1    Oct. 3, 2013

(30) Foreign Application Priority Data
Mar. 30, 2012  (JP) ................. 2012-080877

(51) Int. Cl.
*H01L 29/20* (2006.01)
*H01L 29/40* (2006.01)
*H01L 29/66* (2006.01)
*H01L 29/778* (2006.01)
*H01L 29/06* (2006.01)

(52) U.S. Cl.
CPC .......... *H01L 29/2003* (2013.01); *H01L 29/407* (2013.01); *H01L 29/66462* (2013.01); *H01L 29/7787* (2013.01); *H01L 29/0649* (2013.01)

(58) Field of Classification Search
CPC . H01L 29/10; H01L 29/66462; H01L 29/778; H01L 29/7787; H01L 29/0649; H01L 29/2003; H01L 29/407; H01L 29/408; H01L 29/66431; H01L 29/7786

USPC .......... 257/194, E29.246; 330/277; 438/172
See application file for complete search history.

(56) References Cited

U.S. PATENT DOCUMENTS

| | | | | |
|---|---|---|---|---|
| 6,476,431 B1 * | 11/2002 | Ohno et al. | .................. | 257/280 |
| 7,564,074 B2 * | 7/2009 | Sadaka et al. | ................ | 257/194 |
| 7,642,568 B2 * | 1/2010 | Brar et al. | ..................... | 257/194 |
| 7,655,963 B2 * | 2/2010 | Sadaka et al. | ................ | 257/194 |
| 2002/0182791 A1 * | 12/2002 | Yoshida | ....................... | 438/194 |
| 2003/0205721 A1 * | 11/2003 | Nishii et al. | .................. | 257/194 |

(Continued)

FOREIGN PATENT DOCUMENTS

JP   2008-235738 A1   10/2008
JP   2010-103236 A1   5/2010

OTHER PUBLICATIONS

K. Joshin et al., "A 174 W high-efficiency GaN HEMT power amplifier for W-CDMA base station applications", Dec. 8-10, 2003, Electron Devices Meeting, 2003. IEDM '03 Technical Digest. IEEE International, pp. 12.6.1-12.6.3.*

(Continued)

*Primary Examiner* — Khiem D Nguyen
*Assistant Examiner* — Pauline Vu
(74) *Attorney, Agent, or Firm* — Kratz, Quintos & Hanson, LLP

(57) ABSTRACT

A compound semiconductor device includes a substrate; a buffer layer formed on the substrate; an electron transit layer and an electron donating layer formed on the buffer layer; a gate electrode, a source electrode, and a drain electrode formed on the electron donating layer; and an embedded electrode to which a potential independent of the gate electrode, the source electrode, and the drain electrode is supplied to control a potential of the buffer layer.

14 Claims, 17 Drawing Sheets

(56) References Cited

U.S. PATENT DOCUMENTS

| | | | |
|---|---|---|---|
| 2005/0001235 A1* | 1/2005 | Murata et al. | 257/192 |
| 2005/0253168 A1* | 11/2005 | Wu et al. | 257/192 |
| 2006/0006415 A1* | 1/2006 | Wu et al. | 257/194 |
| 2006/0060895 A1* | 3/2006 | Hikita et al. | 257/280 |
| 2006/0094145 A1* | 5/2006 | Otsuka et al. | 438/31 |
| 2006/0170003 A1* | 8/2006 | Saito et al. | 257/189 |
| 2006/0180831 A1* | 8/2006 | Nakazawa et al. | 257/189 |
| 2007/0257275 A1* | 11/2007 | Taylor | 257/183.1 |
| 2008/0054304 A1* | 3/2008 | Sadaka et al. | 257/194 |
| 2008/0073670 A1* | 3/2008 | Yang et al. | 257/194 |
| 2008/0128752 A1* | 6/2008 | Wu | 257/194 |
| 2009/0230430 A1* | 9/2009 | Miyamoto et al. | 257/192 |
| 2010/0025730 A1* | 2/2010 | Heikman et al. | 257/194 |
| 2010/0032683 A1 | 2/2010 | Ikeda | |
| 2011/0121314 A1* | 5/2011 | Suh et al. | 257/76 |
| 2011/0175142 A1 | 7/2011 | Tsurumi | |
| 2011/0260777 A1* | 10/2011 | Suzuki et al. | 327/493 |
| 2012/0235210 A1* | 9/2012 | Takemae et al. | 257/194 |
| 2013/0069074 A1* | 3/2013 | Lee et al. | 257/76 |
| 2013/0153967 A1* | 6/2013 | Curatola et al. | 257/194 |
| 2013/0248994 A1* | 9/2013 | Ninomiya | 257/334 |

OTHER PUBLICATIONS

Notice of Preliminary Rejection mailed Mar. 26, 2014 from the Korean Intellectual Property Office in counterpart application No. 10-2013-6420 with English translation.

Taiwanese Office Action dated Sep. 19, 2014 in the corresponding Taiwanese patent application No. 101150063, with English translation.

* cited by examiner

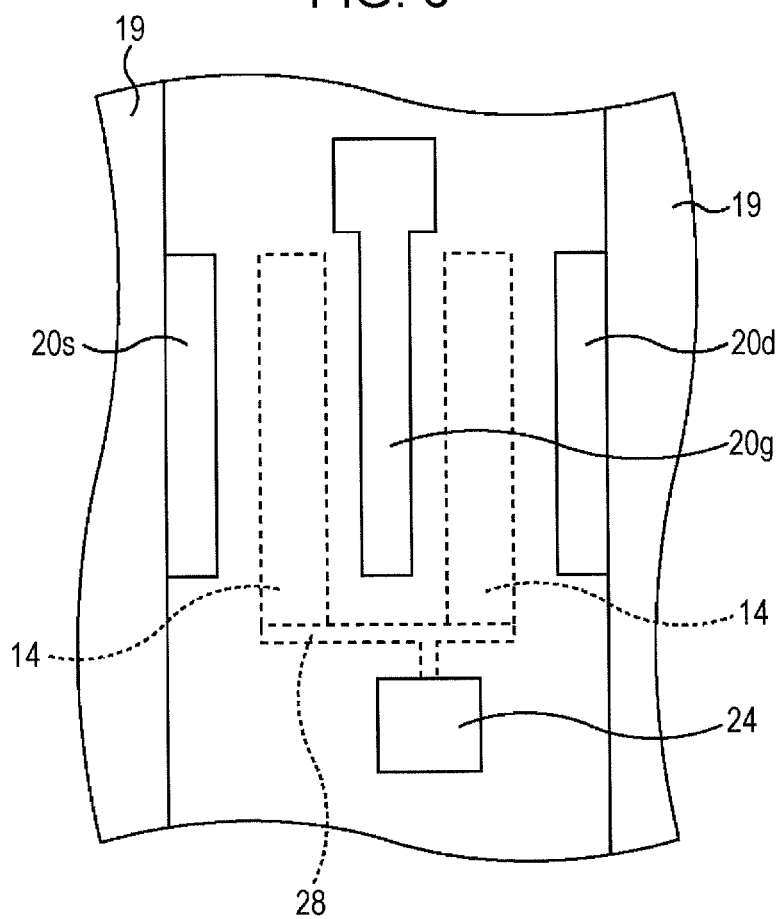

COMPOUND SEMICONDUCTOR DEVICE WITH EMBEDDED ELECTRODE CONTROLLING A POTENTIAL OF THE BUFFER LAYER

CROSS-REFERENCE TO RELATED APPLICATION

This application is based upon and claims the benefit of priority of the prior Japanese Patent Application No. 2012-080877, filed on Mar. 30, 2012, the entire contents of which are incorporated herein by reference.

FIELD

The embodiments discussed herein are related to a compound semiconductor device and a method for manufacturing the same.

BACKGROUND

Nitride semiconductors have the characteristics of high saturated electron velocities, wide band gaps, etc. Therefore, various studies are conducted for applying nitride semiconductors to high-breakdown-voltage and high-output semiconductor devices by utilizing these characteristics. For example, GaN which is one of the nitride semiconductors has a band gap of 3.4 eV larger than the band gap (1.1 eV) of Si and the band gap (1.4 eV) of GaAs. Therefore, GaN has high breakdown electric-field strength and is very promising as a material for semiconductor devices for power supply which is capable of achieving high-voltage operation and high output.

With respect to semiconductor devices using nitride semiconductors, there have been many reports on field-effect transistors, particularly high electron mobility transistors (HEMT). For example, as GaN-based HEMT, AlGaN/GaN-HEMT using GaN for an electron transit layer and AlGaN for an electron-donating layer attracts attention. In the AlGaN/GaN-HEMT, distortion due to a difference in lattice constant between GaN and AlGaN occurs in AlGaN. Thus, a high concentration of two-dimensional electron gas (2DEG) may be produced by piezopolarization due to the distortion and spontaneous polarization of AlGaN. Therefore, the AlGaN/GaN-HEMT is expected as a high-efficiency switch element, a high-breakdown-voltage power device for electromobiles, and the like.

However, a GaN substrate having good crystallinity is very difficult to produce. Therefore, nitride semiconductor layers, for example, a GaN layer and an AlGaN layer, are usually formed by heteroepitaxial growth on a Si substrate, a sapphire substrate, or a SiC substrate. In particular, the Si substrate is easily available at low cost with a large diameter and high quality. Therefore, studies are being actively conducted on a structure in which a GaN layer and an AlGaN layer are grown above a Si substrate.

However, usual GaN-based HEMT using a Si substrate has difficulty in suppressing a leak current flowing between a source and a drain.

Japanese Laid-open Patent Publication No. 2008-235738 discusses a GaN-based semiconductor element, and Japanese Laid-open Patent Publication No. 2010-103236 discusses a nitride semiconductor device.

SUMMARY

According to an aspect of the invention, a compound semiconductor device includes a substrate; a buffer layer formed on the substrate; an electron transit layer and an electron donating layer formed on the buffer layer; a gate electrode, a source electrode, and a drain electrode formed on the electron donating layer; and an embedded electrode to which a potential independent of the gate electrode, the source electrode, and the drain electrode is supplied to control a potential of the buffer layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a drawing illustrating a layout of another modified example of the first embodiment;

DESCRIPTION OF EMBODIMENTS

The inventor conducted study on the cause of difficulty in suppressing a leak current flowing between a source and a drain in usual GaN-based HEMT using a Si substrate. As a result, it was found that the leak current flows through a buffer layer present between the Si substrate and GaN and AlGaN layers. There is a large difference in lattice constant between the Si substrate and the GaN and AlGaN layers. Therefore, good crystallinity may not be achieved by growing the GaN and AlGaN layers directly on the Si substrate. In addition, there is a large difference in thermal expansion coefficient between the Si substrate and the GaN and AlGaN layers. On the other hand, treatment at a high temperature is desired for epitaxial growth of the GaN and AlGaN layers. This treatment at a high temperature may cause warping and cracking in the Si substrate due to the difference in thermal expansion coefficient. Therefore, a usual GaN-based HEMT includes a buffer layer provided between the Si substrate and the GaN layer and the AlGaN layer in order to significantly reduce the difference in lattice constant and the difference in thermal expansion coefficient, the buffer layer serving as a leakage path. Although the leak current may be suppressed by thinning the buffer layer, difficulty occurs in achieving good crystallinity, and warping and cracking easily occur during heat treatment. On the basis of the knowledge, the inventors of the present application conceived that a configuration capable of controlling a potential near the leakage path without thinning of the buffer layer is used.

Embodiments of the present application are described in detail below with reference to the attached drawings.

First Embodiment

Figure 1A:
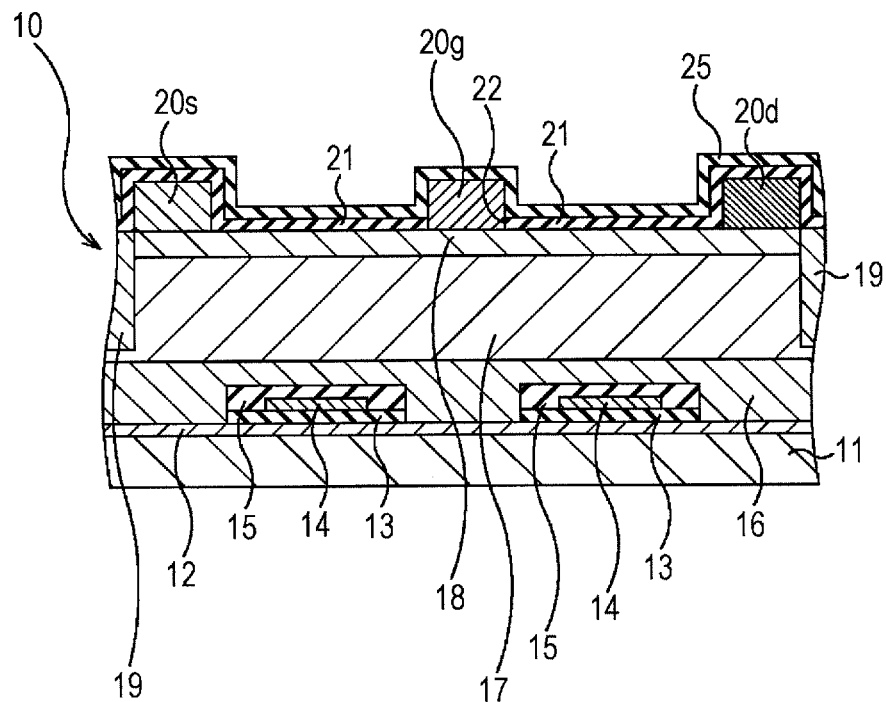
FIGS. 1A and 1B are sectional views illustrating a structure of a compound semiconductor device according to a first embodiment.
Figure 1B:
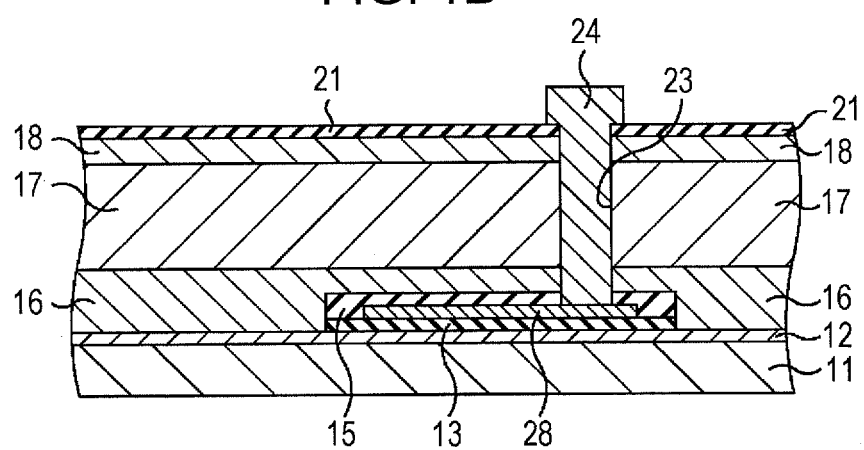
Figure 2:
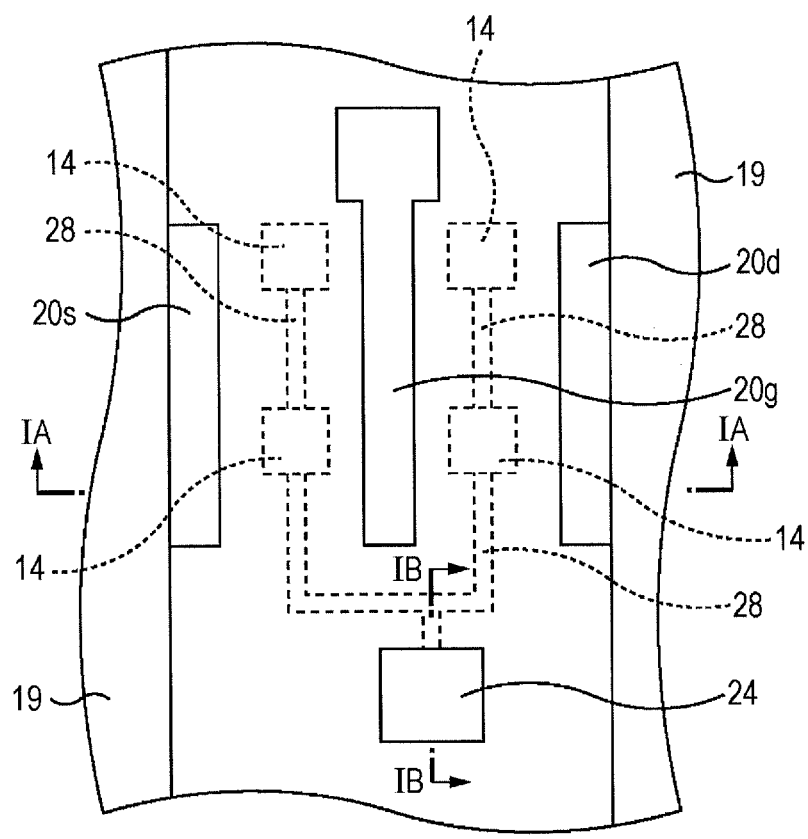
FIG. 2 is a drawing illustrating a layout of the compound semiconductor device according to the first embodiment.

First, a first embodiment is described. FIGS. 1A and 1B are sectional views illustrating a structure of a GaN-based HEMT (compound semiconductor device) according to the first embodiment. FIG. 2 is a drawing illustrating a layout of the GaN-based HEMT (compound semiconductor device) according to the first embodiment.

In the first embodiment, as illustrated in FIG. 1A, a compound semiconductor laminated structure 10 is formed on a substrate 11 such as a Si substrate. The compound semiconductor laminated structure 10 includes an initial layer 12, a buffer layer 16, an electron transit layer 17, and an electron donating layer 18. For example, an AlN layer having a thickness of about 200 nm is used as the initial layer 12. For example, a laminate of a plurality of $Al_xGa_{1-x}N$ layers (0.2<x<0.8) is used as the buffer layer 16, in which an Al composition gradually increases from the initial layer 12 side to the electron transit layer 17 side. The thickness of the buffer layer 16 is, for example, about 500 nm. An i-GaN layer having a thickness of, for example, about 1 μm and not intentionally doped with impurities is used as the electron transit layer 17. In addition, an n-type $Al_{0.2}Ga_{0.8}N$ having a thickness of, for example, about 20 nm is used as the electron donating layer 18. The electron donating layer 18 is doped with n-type impurities, for example, Si at a concentration of about $5\times10^{18}$ $cm^{-3}$.

In this embodiment, a plurality of insulating films 13 are formed on the initial layer 12, and an embedded electrode 14 is formed on each of the insulating films 13. Further, an insulating film 15 is formed on each of the insulating films 13 to cover the upper and side surfaces of the embedded electrode 14. The plurality of insulating films 13 are arranged, for example, in a lattice pattern on the initial layer 12. A silicon oxide film having a thickness of, for example, 50 nm is used as each of the insulating films 13. A conductive film having a thickness of, for example, 30 nm is used as the embedded electrode 14. A refractory metal such as W, Ta, or the like is preferably used as a material of the conductive film. This is because it is thermally stable. Also, Pt, Ni, Au, Ti, and the like may be used as the material for the conductive film. A Si oxide film having a thickness of, for example, of 50 nm is used as the insulating films 15. The insulating films 13, the embedded electrodes 14, and the insulating films 15 are also included in the compound semiconductor laminated structure 10.

As illustrated in FIG. 1B, the embedded electrodes 14 are connected to embedded wiring 28 to which a pad 24, i.e., an external terminal, is connected. For example, Au or the like is used as a material for the pad 24.

In the compound semiconductor laminated structure 10, an element separation region 19, which defines an element region, is formed. Within the element region, a source electrode 20s and a drain electrode 20d are formed on the electron donating layer 18. An insulating film 21 is formed on the electron donating layer 18 to cover the source electrode 20s and the drain electrode 20d. In addition, an opening 22 is formed in the insulating film 21 to be positioned between the source electrode 20s and the drain electrode 20d, and a gate electrode 20g is provided to make Schottky contact with the electron donating layer 18 through the opening 22. In addition, an insulating film 25 is formed on the insulating film 21 to cover the gate electrode 20g. The material for the insulating films 21 and 25 is not particularly limited but, for example, a Si nitride film is used. The insulating films 21 and 25 are an example of termination films.

As described above, the plurality of insulating films 13 are arranged in, for example, a lattice pattern on the initial layer 12. Therefore, as illustrated in FIG. 2, the embedded electrodes formed on the respective insulating films 13 are also arranged in a lattice pattern. The distance between the embedded electrodes 14 is, for example, about 2 μm. The embedded electrodes 14 are connected in common to the pad 24 through the embedded wiring 28. FIG. 1A illustrates a section taken along line IA-IA in FIG. 2, and FIG. 1B illustrates a section taken along line IB-IB in FIG. 2.

In the GaN-based HEMT configured as described above, any potential may be applied to the pad 24 from the outside. The applied potential is applied to each of the embedded electrodes 14. Therefore, the potential around each of the embedded electrodes 14 may be arbitrarily controlled. That is, the electric field of a region serving as a leakage path in usual GaN-based HEMT may be arbitrarily controlled. Consequently, a leak current between the source and the drain may be significantly controlled by applying a potential, for example, a potential of about −5 V, enough to deplete a region which may become a leakage path to the pad 24.

Figure 3:
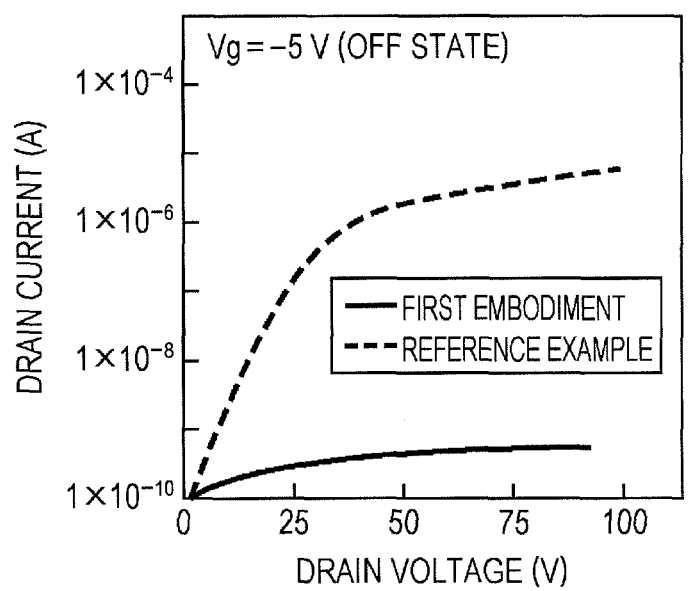
FIG. 3 is a graph illustrating a relation between drain voltage and drain current.

FIG. 3 illustrates a relation between drain voltage and drain current. As illustrated in FIG. 3, comparison between the first embodiment and a reference example in which the potential is not controlled using the embedded electrodes 14 indicates that when the gate electrode 20g is turned off by applying a gate potential Vg of −5 V, the drain current, i.e., a leak current between the source and the drain, may be significantly controlled in the first embodiment.

In addition, since each of the embedded electrodes 14 is covered with the insulating films 13 and 15, even when a potential is applied to the embedded electrodes 14, a current flowing between the embedded electrodes 14 and the surrounding compound semiconductor layers (the buffer layer 16, the electron transit layer 17, etc) is negligible. When a relatively large current flows between each of the embedded electrodes 14 and the surrounding compound semiconductor layers, it is difficult to achieve satisfactory characteristics even by controlling the leak current between the source and the drain.

According to this embodiment, excellent characteristics may be achieved.

Next, a method for producing the GaN-based HEMT (compound semiconductor device) according to the first embodiment is described. FIGS. 4A to 4J are each a sectional view illustrating, in the order of steps, the method for producing the GaN-based HEMT (compound semiconductor device) according to the first embodiment. FIG. 4I illustrates a section take along line IB-IB in FIG. 2, and the other figures each illustrate a section taken along line IA-IA in FIG. 2.

Figure 4A:
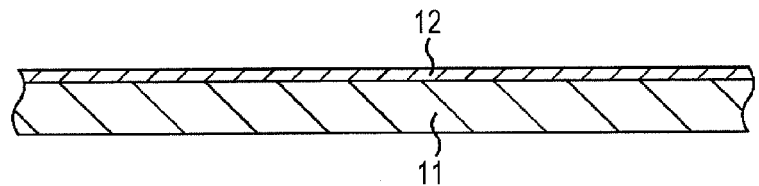
FIGS. 4A to 4D are sectional views illustrating, in the order of steps, a method for manufacturing the compound semiconductor device according to the first embodiment.
Figure 4B:
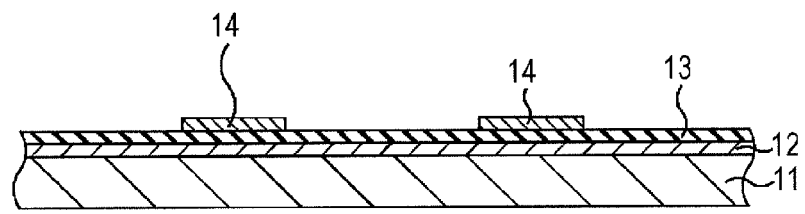
Figure 4C:
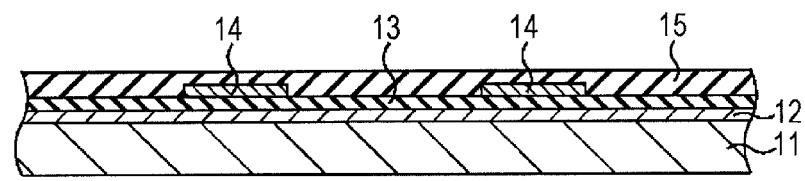
Figure 4D:
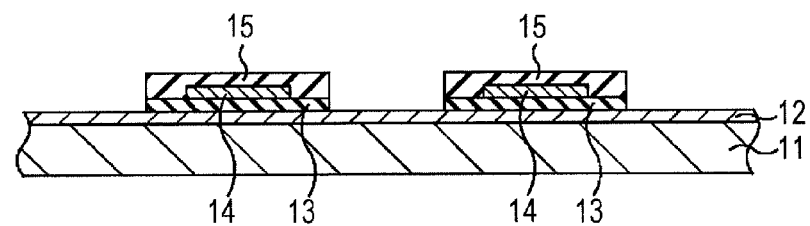

First, as illustrated in FIG. 4A, the initial layer 12 is formed on the substrate 11. The initial layer 12 may be formed by, for example, a metal organic chemical vapor deposition (MOCVD) method or a crystal growth method such as a molecular beam epitaxy (MBE) method. Next, as illustrated in FIG. 4B, the insulating film 13 is formed on the initial film 12, and the embedded electrodes 14 are formed on the insulating film 13. The embedded electrodes 14 may be formed by, for example, a liftoff method. That is, a photoresist pattern having exposed regions in which the embedded electrodes 14 are to be formed is formed, a metal film is formed by a vapor deposition method using the pattern as a growth mask, and then the pattern is removed together with the metal film formed thereon. The embedded wiring 28 is also formed in parallel with the embedded electrodes 14. Then, as illustrated in FIG. 4C, the insulating film 15 is formed on the insulating film 13 so as to cover the embedded electrodes 14 and the embedded wiring 28. Then, as illustrated in FIG. 4D, the insulating film 15 and the insulating film 13 are patterned.

Figure 4E:
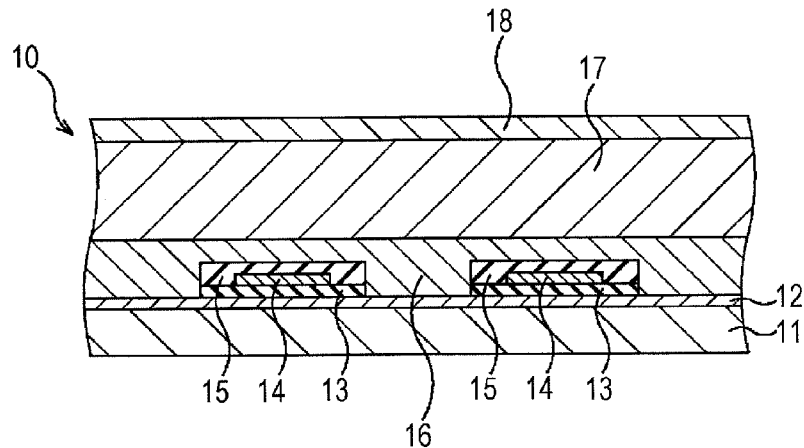
FIGS. 4E to 4G are sectional views illustrating, in the order of steps, the method for manufacturing the compound semiconductor device in succession to FIG. 4D.

Next, as illustrated in FIG. 4E, the buffer layer 16 is formed on the initial layer 12 so as to cover the laminates each including the insulating film 13, the embedded electrode 14, and the insulating film 15, and the electron transit layer 17 and the electron donating layer 18 are formed on the buffer layer 16. The buffer layer 16, the electron transit layer 17, and the electron donating layer 18 are formed by, for example, a MOCVD method, a MBE method, or the like. As a result, the compound semiconductor laminated structure 10 including the initial layer 12, the insulating films 13, the embedded electrodes 14, the insulating films 15, the electron transit layer 17, and the electron donating layer 18 is produced.

When the compound semiconductor layers included in the compound semiconductor laminated structure 10 are formed by the MOCVD method, for example, mixed gas containing trimethylaluminum (TMA) gas as an Al source, trimethylgallium (TMG) gas as a Ga source, and ammonia ($NH_3$) gas as an N source is used. In this case, the presence of supply and flow rates of trimethylaluminum gas and trimethylgallium gas are appropriately determined according to the composition of a compound semiconductor layer to be grown. The flow rate of ammonia gas used as a raw material common to the compound semiconductor layers is about 100 sccm to 10 slm. In addition, for example, the growth pressure is about 50 Torr to 300 Torr, and the growth temperature is about 900° C. to 1100° C. In growing an n-type compound semiconductor layer (e.g., the electron donating layer 18), for example, the compound semiconductor layer is doped with Si by adding Si-containing $SiH_4$ gas at a predetermined flow rate to the mixed gas. The Si doping concentration is about $1 \times 10^{18}$ cm$^{-3}$ to $1 \times 10^{20}$ cm$^{-3}$, for example, about $5 \times 10^{18}$ cm$^{-3}$. Even when the embedded electrodes 14 are partially decomposed during the formation of the buffer layer 16, diffusion of the elements of the electrodes 14 into the buffer layer 16 etc. is suppressed by the insulating films 13 and 15.

In addition, it is difficult to grow the compound semiconductor layers in the lamination direction on the surface of the insulating film 15. In this embodiment, therefore, the buffer layer 16 is formed by epitaxial lateral overgrowth (ELO). In this case, the buffer layer 16 is first epitaxially grown in the lamination direction (vertical direction to the surface of the insulating films 15) from portions of the surface of the initial layer 12, which are exposed between the insulating films 15. When the buffer layer 16 reaches the surfaces of the insulating films 15, lateral growth starts to cover the surfaces of the insulating films 15 while growth in the lamination direction is continued. Consequently, the buffer layer 16 is formed to cover the surfaces of the insulating films 15.

Figure 4F:
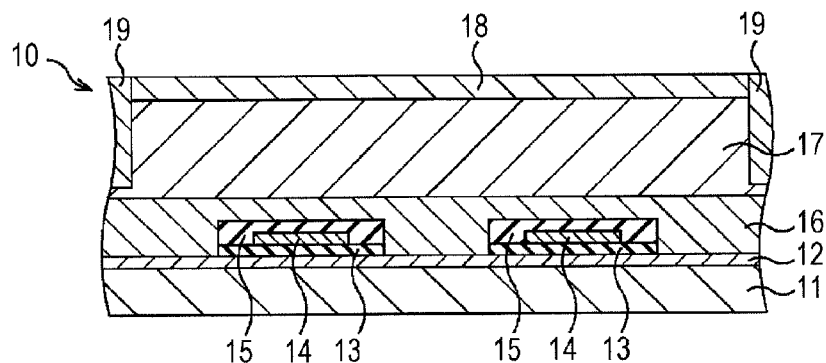
Figure 4G:
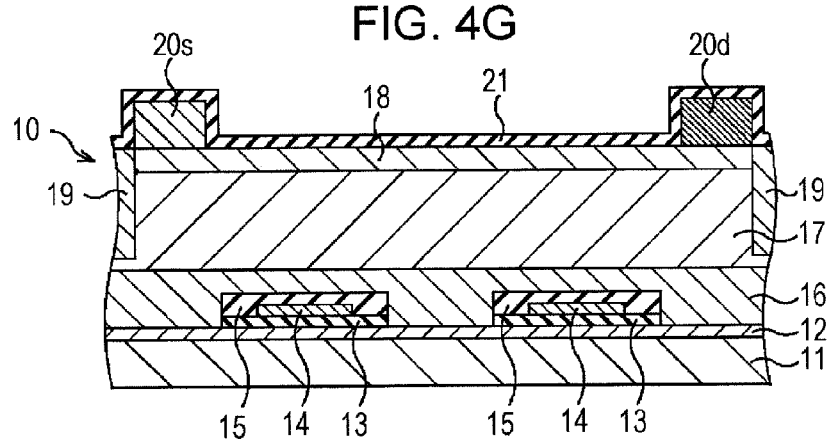

As illustrated in FIG. 4F, after the electron donating film 18 is formed, the element separation region 19 which defines the element region is formed in the compound semiconductor laminated structure 10. In order to form the element separation region 19, a photoresist pattern is formed on the compound semiconductor laminated structure 10 to expose, for example, a region where the element separation region 19 is to be formed, and ion of Ar or the like is implanted using the pattern as a mask. Dry etching with chlorine-based gas may be performed using the pattern as an etching mask. Then, as illustrated in FIG. 4G, within the element region, the source electrode 20s and the drain electrode 20d are formed on the electron donating layer 18. The source electrode 20s and the drain electrode 20d may be formed by, for example, a liftoff method. That is, a photoresist pattern is formed to expose a region where the source electrode 20s is to be formed and a region where the drain electrode 20d is to be formed and cover the other regions. Then, a metal film is formed by a vapor deposition method using the pattern as a mask, and then the pattern is removed together with the metal film formed thereon. In forming the metal film, for example, a Ti film having a thickness of about 100 nm is formed, and then an Al film having a thickness of about 300 nm is formed. Then, heat treatment (for example, RTA: rapid thermal annealing) is performed in, for example, a $N_2$ gas atmosphere at 400° C. to 1000° C. (for example, 600° C.), making ohmic contact. After the source electrode 20s and the drain electrode 20d are formed, the insulating film 21 is formed on the electron donating layer 18 so as to cover the source electrode 20s and the drain electrode 20d. The insulating film 21 is preferably formed by, for example, an atomic layer deposition (ALD) method, a plasma chemical vapor deposition (CVD) method, or a sputtering method.

Figure 4H:
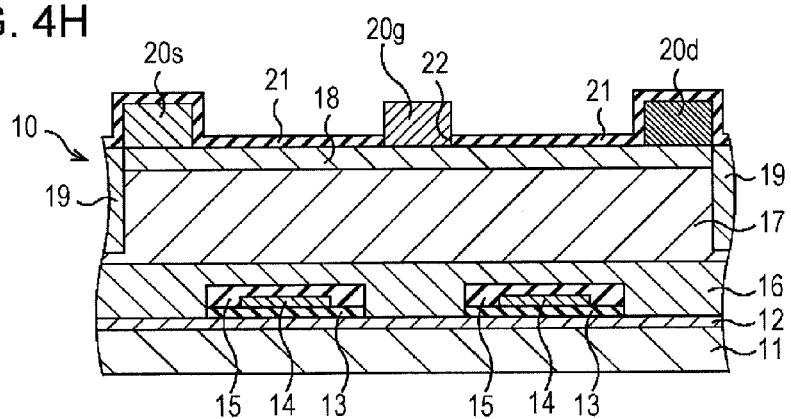
FIGS. 4H to 4J are sectional views illustrating, in the order of steps, the method for manufacturing the compound semiconductor device in succession to FIG. 4G.
Figure 4I:
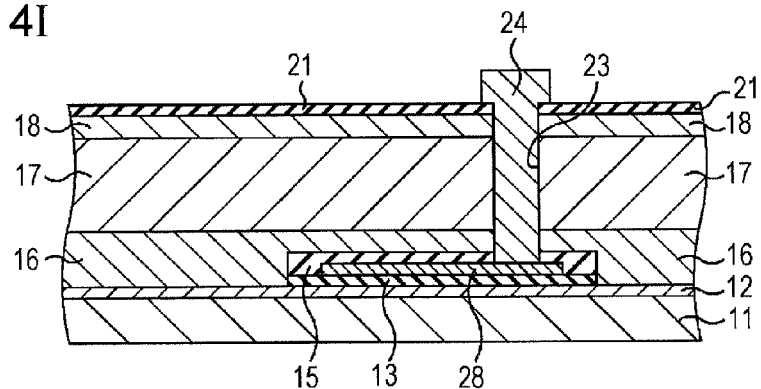

Then, as illustrated in FIG. 4H, the opening 22 is formed in a region where the gate electrode is to be formed in the insulating film 21. The opening 22 may be formed by, for example, dry etching, wet etching, or ion milling. Then, the gate electrode 20g is formed in the opening 22. The gate electrode 20g may be formed by, for example, a liftoff method. That is, a photoresist pattern is formed to expose the region where the gate electrode 20g is to be formed, a metal film is formed by a vapor deposition method using the pattern as a mask, and then the pattern is removed together with the metal film formed thereon. In forming the metal film, for example, a Ni film having a thickness of about 50 nm is formed, and then an Au film having a thickness of about 300 nm is formed.

Figure 4J:
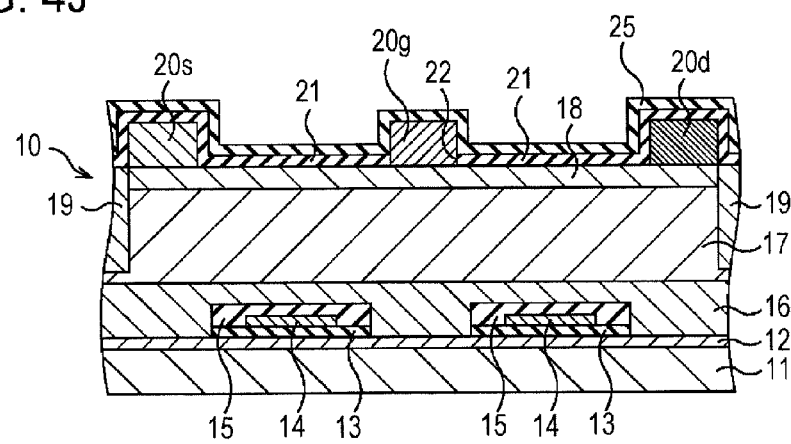

Then, as illustrated in FIG. 4I, the opening 23 is formed in the insulating film 21, the electron donating layer 18, the electron transit layer 17, the buffer layer 16, and the insulating film 15 until reaching the embedded wiring 28. The opening 23 may be formed by, for example, dry etching such as reactive ion etching (RIE). In this case, for example, chlorine-based gas such as $Cl_2$, $BCl_3$, or the like may be used as etching gas. After the opening 23 is formed, the pad 24 is formed on the insulating film 21 so as to be connected to the embedded wiring 28 through the opening 23. Then, as illustrated in FIG. 4J, the insulating film 25 is formed on the insulating film 21 to cover the gate electrode 20g and the pad 24. Like the insulating film 21, the insulating film 25 is preferably formed by, for example, an ALD method, a plasma CVD method, or a sputtering method.

Consequently, the GaN-based HEMT according to the first embodiment may be manufactured.

Figure 5A:
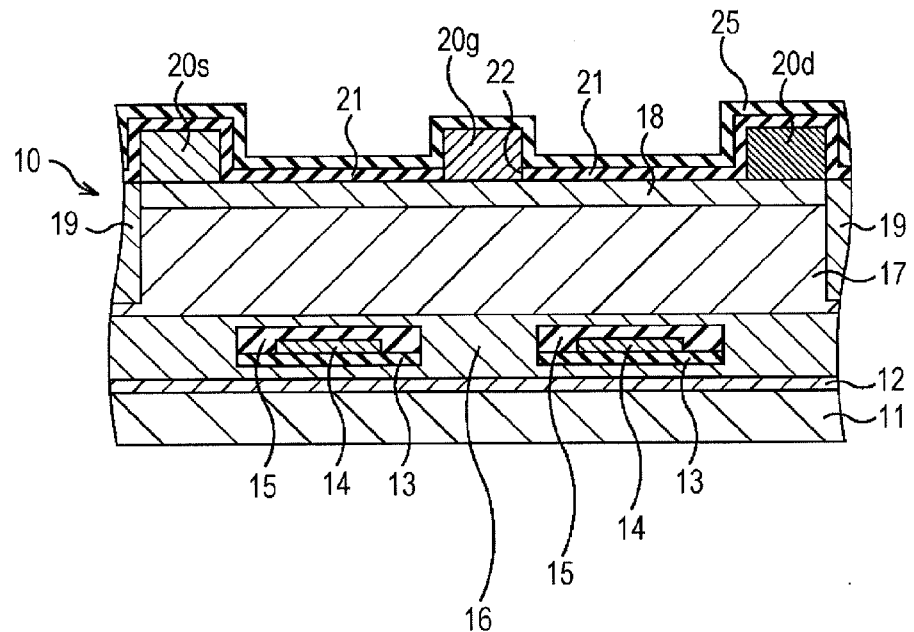
FIGS. 5A and 5B are sectional views illustrating a modified example of the first embodiment.
Figure 5B:
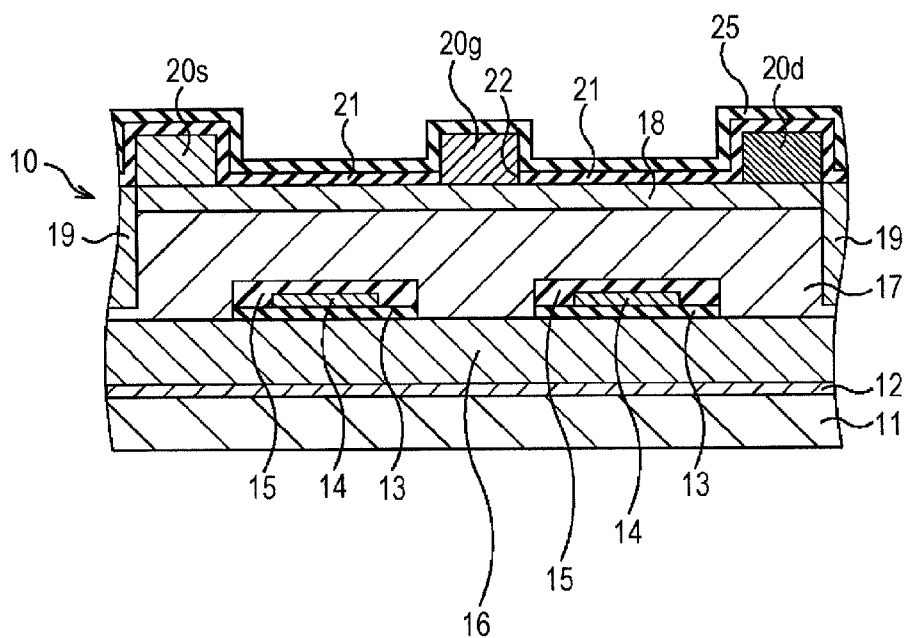

In addition, the position of the laminates each including the embedded electrode 14 and the insulating films 13 and 15 surrounding the electrode 14 in the lamination direction of the compound semiconductor laminated structure 10 is not particularly limited as long as a leak current flowing through the buffer layer 16 may be suppressed by the potential applied to the embedded electrode 14. For example, as illustrated in FIG. 5A, the laminates may be disposed between the upper and lower surfaces of the buffer layer 16, or as illustrated in FIG. 5B, the laminates may be disposed on the buffer layer 16. Namely, the laminates may be disposed between the upper and lower surfaces of the electron transit layer 17. In order to suppress a leak current flowing through the buffer layer 16, the embedded electrodes 14 are preferably disposed between the upper and lower surfaces of the buffer layer 16.

In addition, the arrangement form of the embedded electrodes 14 is not particularly limited, and for example, as illustrated in FIG. 6, the electrodes may be arranged in a comb-like form. In any arrangement form of the embedded electrodes 14, for example, a lattice form or a comb-like form, the distance between the embedded electrodes 14 is preferably 10 µm or less. This is aimed at effectively depleting a region which may become a leakage path.

Figure 7A:
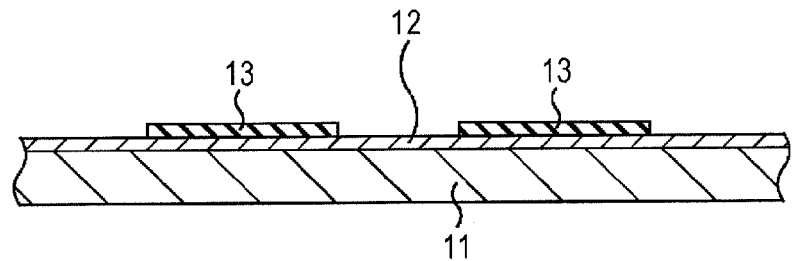
FIGS. 7A to 7C are sectional views illustrating, in the order of steps, a modified example of the method for manufacturing the compound semiconductor device according to the first embodiment.
Figure 7B:
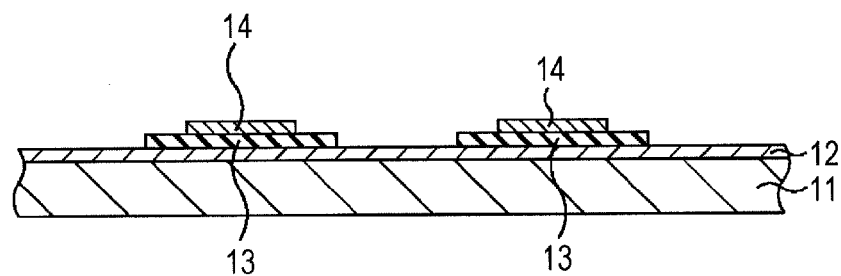
Figure 7C:
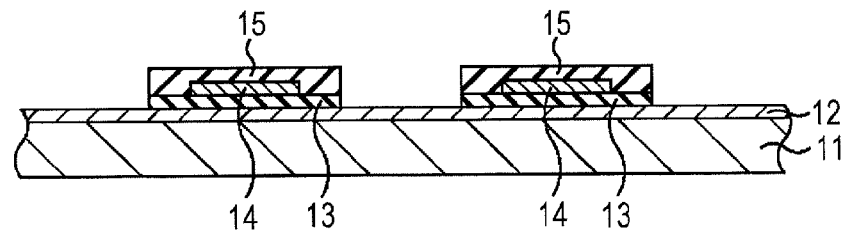

Further, the laminate including the embedded electrode 14 and the insulating films 13 and 15 surrounding the electrode 14 may be formed by a method illustrated in FIGS. 7A to 7C. In this method, first, as illustrated in FIG. 7A, the initial layer 12 is formed, and then the insulating film 13 is formed and patterned. Next, as illustrated in FIG. 7B, the embedded electrodes 14 are formed on the insulating film 13. Then, the insulating film 15 is formed and patterned. The laminate may be formed as described above.

Second Embodiment

Figure 8:
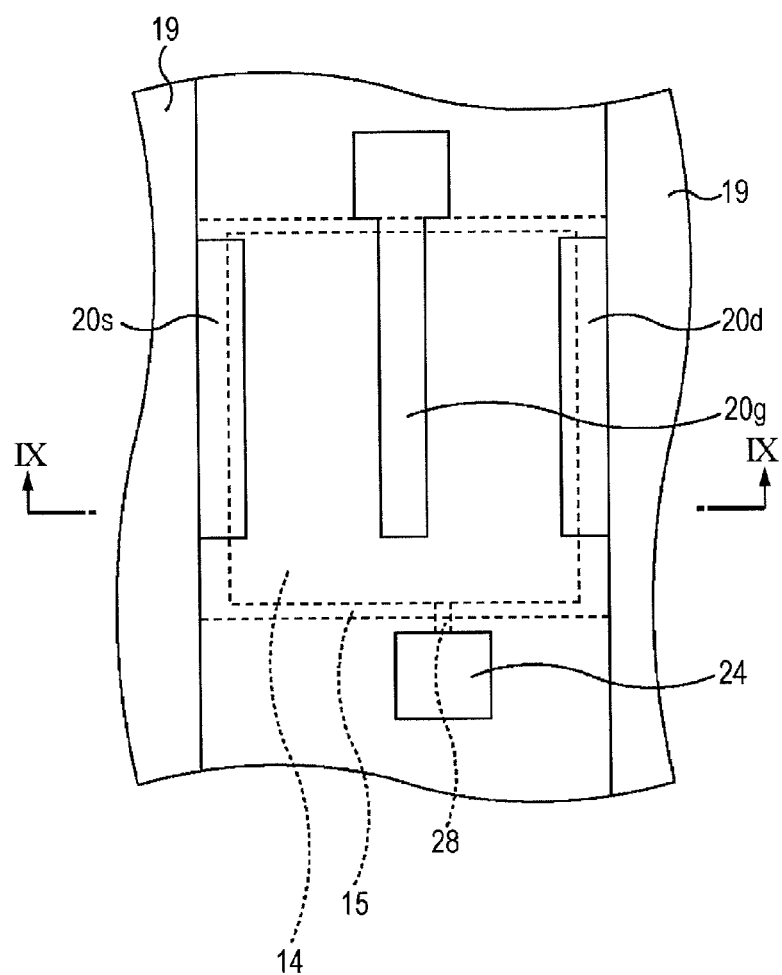
FIG. 8 is a drawing illustrating a layout of a compound semiconductor device according to a second embodiment.
Figure 9:
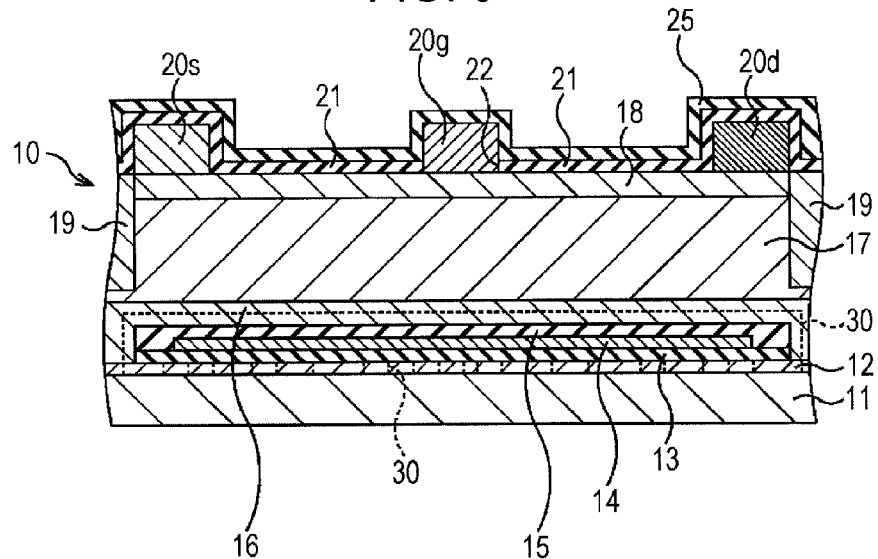
FIG. 9 is a sectional view illustrating a structure of the compound semiconductor device according to the second embodiment.

Next, a second embodiment is described. FIG. 8 is a drawing illustrating a layout of GaN-based HEMT (compound semiconductor device) according to a second embodiment, and FIG. 9 is a sectional view illustrating a structure of the GaN-based HEMT (compound semiconductor device) according to the second embodiment. FIG. 9 illustrates a section taken along line IX-IX in FIG. 8.

As illustrated in FIGS. 8 and 9, in the second embodiment, an insulating film 15 is formed to extend from below a source electrode 20s to below a drain electrode 20d. That is, the insulating film 15 is formed over substantially the entire of an element region. Accordingly, an electrode 14 and an insulating film 13 are also formed to be wider than in the first embodiment. The remaining configuration is the same as in the first embodiment.

Figure 10:
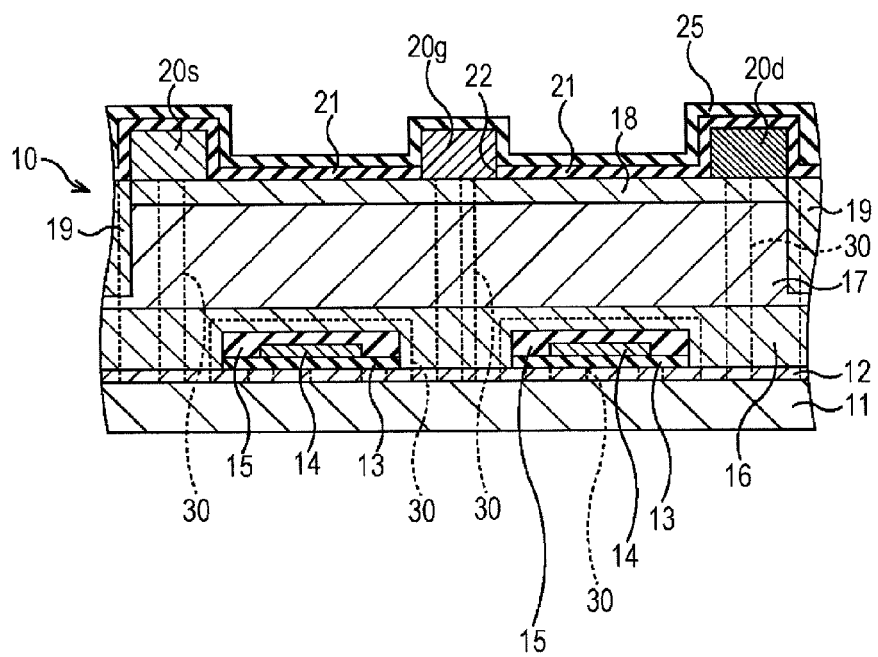
FIG. 10 is a sectional view illustrating dislocations in the first embodiment.

In the second embodiment, the same advantages as in the first embodiment may be achieved. In addition, the most part of the buffer layer 16 within the element region is disposed above the insulating film 15. This represents that the most part of the buffer layer 16 within the element region is formed by epitaxial lateral overgrowth. Although compound semiconductor layers include various dislocations, the density of dislocations extending in the lamination direction in a region formed by the epitaxial lateral overgrowth is very lower than that in a region formed by vertical growth. For example, as illustrated in FIG. 9, in the second embodiment, dislocations 30 extending in the lateral direction (perpendicular to the lamination direction) are easily included in the buffer layer 16, but dislocations 30 extending in the vertical direction (lamination direction) are very few. This is due to the fact that dislocations easily extend in a crystal growth direction. On the other hand, in the first embodiment, even when the buffer layer 16 is formed by epitaxial lateral overgrowth, as illustrated in FIG. 10, dislocations reaching the surface of the buffer layer 16 are present in regions between the insulating films 15. That is, the dislocations passing through the buffer layer 16 from the lower surface to the upper surface are present. The dislocations 30 may be referred to as "threading dislocations". The threading dislocations are transferred to a compound semiconductor layer epitaxially grown thereon. Therefore, in the second embodiment, dislocations, i.e., crystal defects, included in the electron transit layer 17 and the electron donating layer 18 are significantly fewer than that in the first embodiment. Thus, in the second embodiment, the effect of further improving electron mobility and decreasing current collapse may be achieved.

Figure 11A:
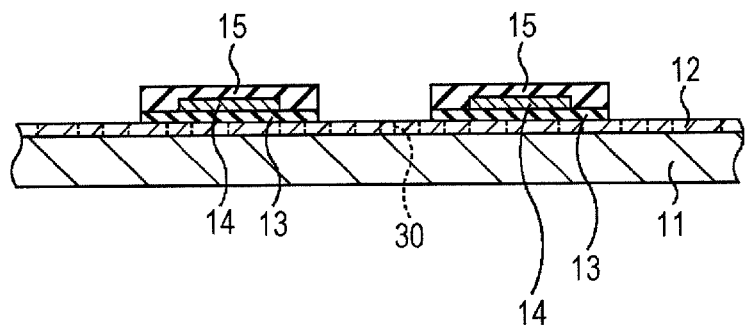
FIGS. 11A to 11C are sectional views illustrating changes in dislocations.
Figure 11B:
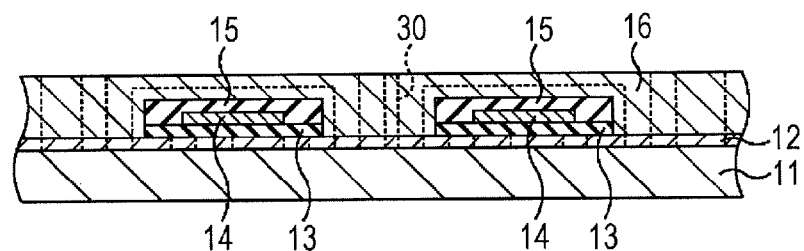
Figure 11C:
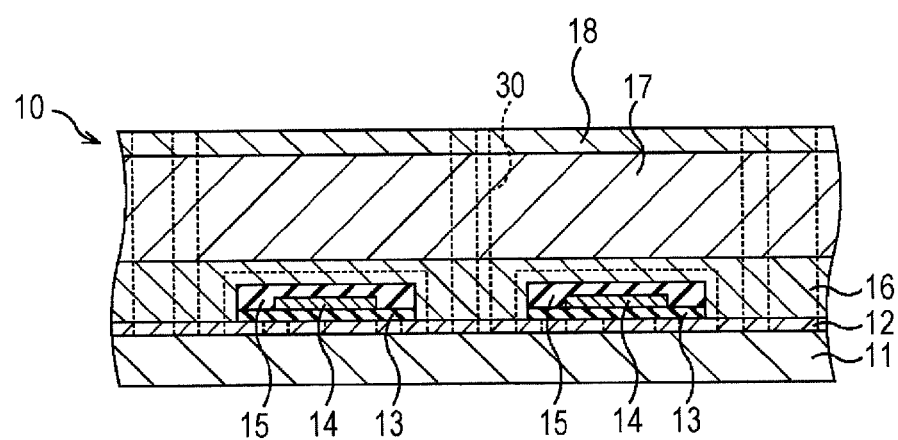

Here, a relation between epitaxial lateral overgrowth and dislocations is described. FIGS. 11A to 11C are drawings illustrating changes in state of dislocations in the first embodiment. FIG. 11A indicates that the initial layer 12 inevitably includes dislocations 30, part of which reach the surface of the initial layer 12. After the insulating films 13, the embedded electrodes 14, and the insulating films 15 are formed, when the buffer layer 16 is formed by epitaxial lateral overgrowth, part of the dislocations 30 in the initial layer 12 are transferred to the buffer layer 16 from portions exposed between the laminates each including the insulating film 13, the embedded electrode 14, and the insulating film 15. In this case, as illustrated in FIG. 11B, part of the dislocations 30 extend in the lateral direction along the surfaces of the insulating films 15 and part of the dislocations 30 reach the upper surface of the buffer layer 16. That is, threading dislocation occurs. Therefore, when the electron transit layer 17 and the electron donating layer 18 are subsequently formed, as illustrated in FIG. 11C, the treading dislocations are easily included in the electron transit layer 17 and the electron donating layer 18. On the other hand, in the second embodiment, the buffer layer 16 includes few threading dislocations, and thus the electron transit layer 17 and the electron donating layer 18 also include few threading dislocations.

In both the first and second embodiments, a conductive compound semiconductor may be used for the embedded electrodes 14. Namely, the embedded electrodes 14 may include a conductive compound semiconductor layer. An example of the compound semiconductor layer is a GaN layer ($n^+$-GaN layer) doped with a high concentration of n-type impurity. Like the other compound semiconductor layers, the embedded electrodes 14 may be formed by a MOCVD method or a MBE method. In addition, Si may be used as the n-type impurity, and for this purpose, for example, $SiH_4$ gas may be added to the mixed gas. Further, the same material as for the source electrode 20s and the drain electrode 20d is preferably used as a material for the pad 24 in order to make ohmic contact. For example, a laminate of a Ti film and an Al film is preferably used.

When such a compound semiconductor is used for the embedded electrodes 14, the embedded layers 14 have higher stability during formation of the buffer layer 16, the electron transit layer 17, and the electron donating layer 18 as compared with use of a metal. Therefore, the decomposition and outside diffusion of the material of the embedded electrodes 14 little occur.

Third Embodiment

Figure 12:
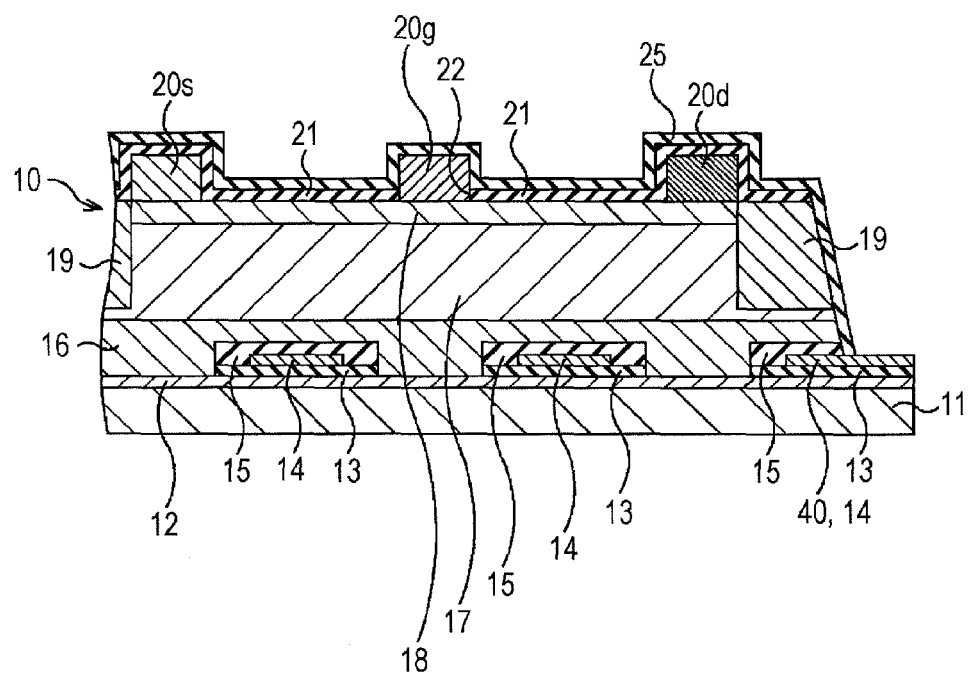
FIG. 12 is a sectional view illustrating a structure of a compound semiconductor device according to a third embodiment.

Next, a third embodiment is described. FIG. 12 is a sectional view illustrating a structure of GaN-based HEMT (compound semiconductor device) according to a third embodiment.

Unlike in the first embodiment, in the third embodiment, as illustrated in FIG. 12, the opening 23 and the pad 24 are not provided, but one of the embedded electrodes 14 is partially exposed. The remaining structure is the same as in the first embodiment. The partially exposed embedded electrode 14 is used as a pad 40, i.e., an external terminal, for the other embedded electrodes 14 connected to the exposed embedded electrode 14.

In the third embodiment, the same effect as in the first embodiment can be achieved. In addition, the pad 40 may be formed by treatment, for example, dry etching to expose a portion of the embedded electrodes 14, and thus the semiconductor device may be more simply manufactured as compared with the first embodiment.

The pad 40 in the third embodiment may be applied to the second embodiment.

Fourth Embodiment

Figure 13:
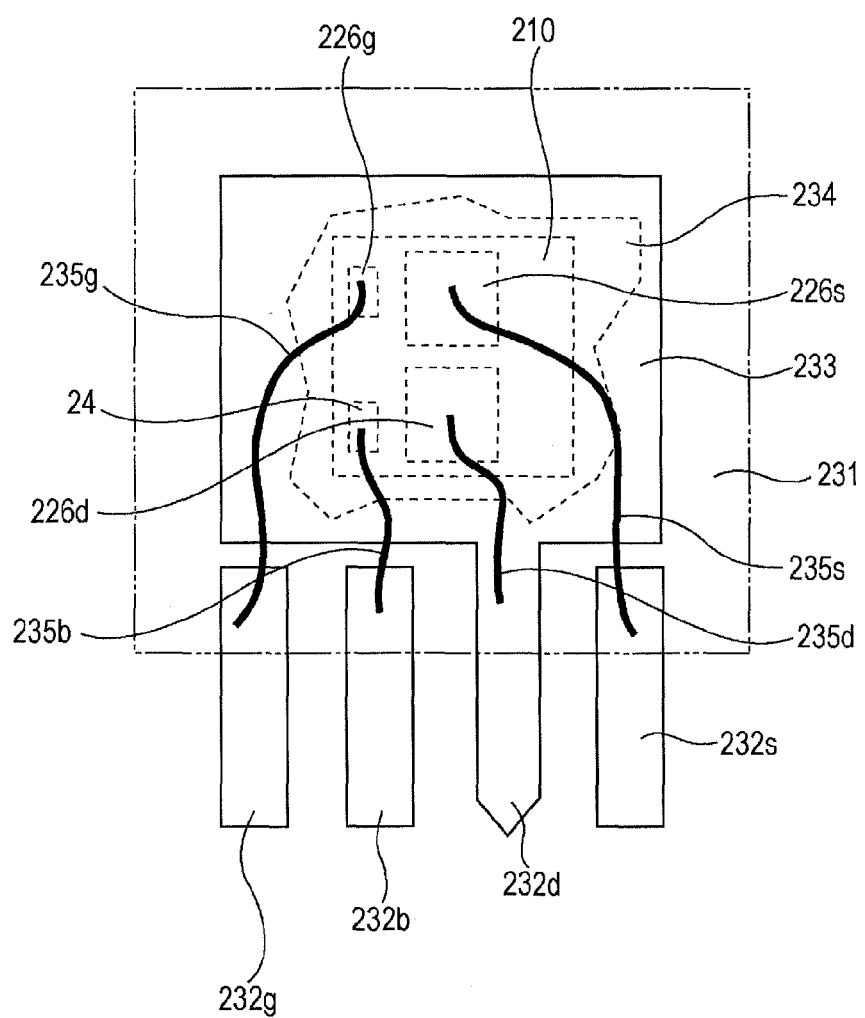
FIG. 13 is a drawing illustrating a discrete package according to a fourth embodiment.

A fourth embodiment relates to a discrete package of a compound semiconductor device including GaN-based HEMT. FIG. 13 is a drawing illustrating a discrete package according to the fourth embodiment.

In the fourth embodiment, as illustrated in FIG. 13, the rear side of a HEMT chip 210 of the compound semiconductor device according to any one of the first to third embodiments is fixed to a land (die pad) 233 with a die attach 234 such as solder. In addition, a wire 235$d$ such as an Al wire is connected to a drain pad 226$d$ to which the drain electrode 20$d$ is connected, the other end of the wire 235$d$ being connected to a drain lead 232$d$ integrated with the land 233. A wire 235$s$ such as an Al wire is connected to a source pad 226$s$ connected to the source electrode 20$s$, the other end of the wire 235$s$ being connected to a source lead 232$s$ independent of the land 233. A wire 235$g$ such as an Al wire is connected to a gate pad 226$g$ connected to the gate electrode 20$g$, the other end of the wire 235$g$ being connected to a gate lead 232$g$ independent of the land 233. A wire 235$b$ such as an Al wire is connected to the pad 24 (in the third embodiment, the pad 40) connected to the embedded electrodes 14, the other end of the wire 235$b$ being connected to a potential-imparting lead 232$b$ independent of the land 233. Further, the land 233 and the HEMT chip 210 etc. are packaged with a mold resin 231 so as to project portions of the potential-imparting lead 232$b$ and the gate lead 232$g$, a portion of the drain lead 232$d$, and a portion of the source lead 232$s$.

This discrete package may be manufactured by, for example, as follows. First, the HEMT chip 210 is fixed to the land 233 of a lead frame with the die attach 234 such as solder. Next, the pad 24 (in the third embodiment, the pad 40), a gate pad 226$g$, a drain pad 226$d$, and a source pad 226$s$ are connected to the potential-imparting lead 232$b$, the gate lead 232$g$, the drain lead 232$d$, and the source lead 232$s$ of the lead frame by bonding with the wires 235$b$, 235$g$, 235$d$, and 235$s$, respectively. Then, sealing with the mold resin 231 is performed by a transfer mold method. Then, the lead frame is separated.

Fifth Embodiment

Figure 14:
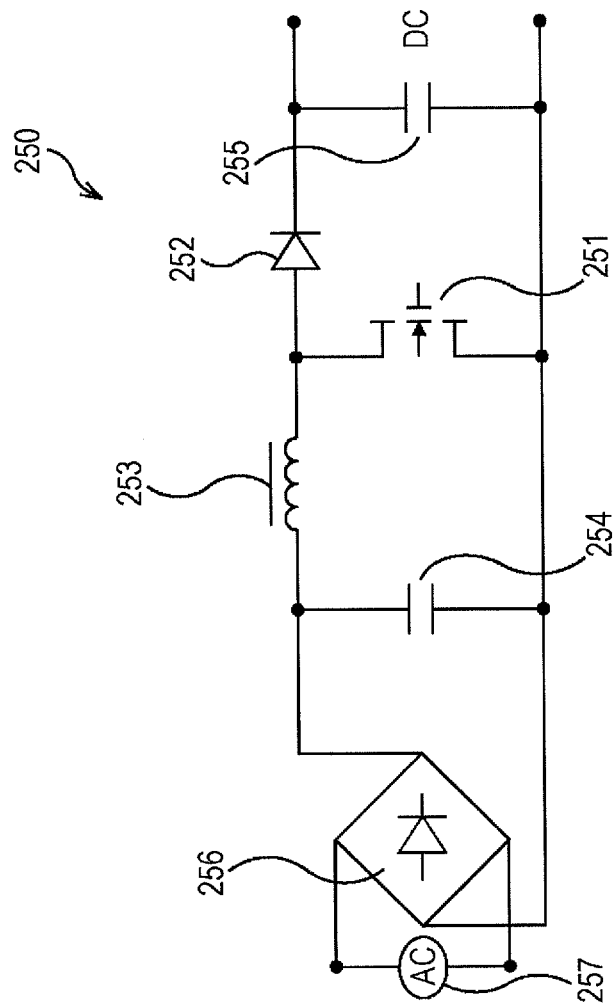
FIG. 14 is a connection diagram illustrating a PFC circuit according to a fifth embodiment.

Next, a fifth embodiment is described. The fifth embodiment relates to a PFC (Power Factor Correction) circuit including the compound semiconductor device including GaN-based HEMT. FIG. 14 is a connection diagram illustrating the PFC circuit according to the fifth embodiment.

A PFC circuit 250 is provided with a switch element (transistor) 251, a diode 252, a choke coil 253, capacitors 254 and 255, a diode bridge 256, and an alternating-current power supply (AC) 257. A drain electrode of the switch element 251 is connected to an anode terminal of the diode 252 and a terminal of the choke coil 253. A source electrode of the switch element 251 is connected to a terminal of the capacitor 254 and a terminal of the capacitor 255. The other terminal of the capacitor 254 is connected to the other terminal of the choke coil 253. The other terminal of the capacitor 255 is connected to the cathode terminal of the diode 252. In addition, a gate driver is connected to a gate electrode of the switch element 251. The AC 257 is connected between both terminals of the capacitor 254 through the diode bridge 256. A direct-current power supply (DC) is connected between both terminals of the capacitor 255. In this embodiment, the compound semiconductor device according to any one of the first to third embodiments is used for the switch element 251.

In manufacturing the PFC circuit 250, the switch element 251 is connected to the diode 252 and the choke coil 253 by using, for example, solder.

Sixth Embodiment

Figure 15:
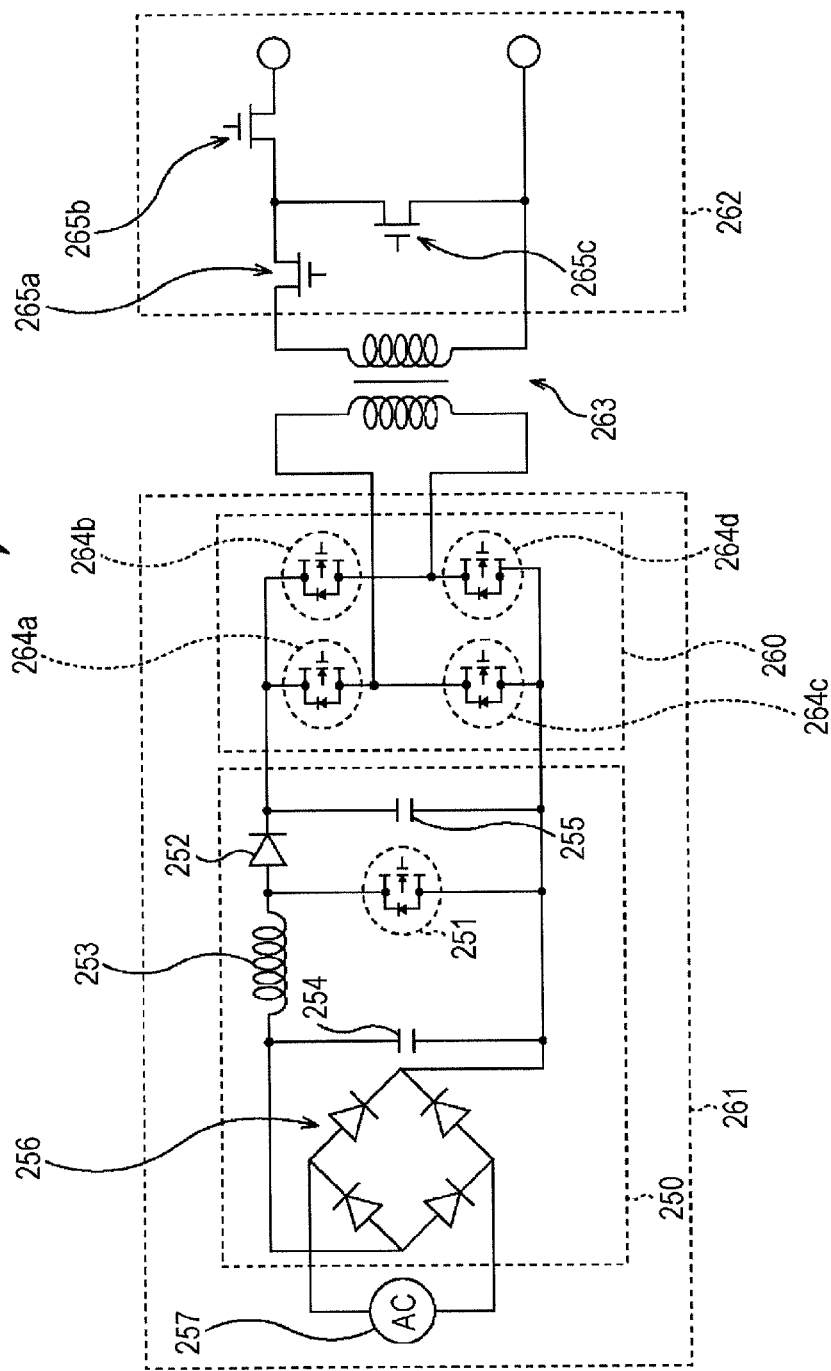
FIG. 15 is a connection diagram illustrating a power device according to a sixth embodiment.

Next, a sixth embodiment is described. The sixth embodiment relates to a power device provided with a compound semiconductor device including GaN-based HEMT. FIG. 15 is a connection diagram illustrating a power device 260 according to the sixth embodiment.

The power device 260 includes a high-voltage primary-side circuit 261 and a low-voltage secondary-side circuit 262, and a transformer 263 disposed between the primary side circuit 261 and the secondary-side circuit 262.

The primary-side circuit 261 is provided with the PFC circuit 250 according to the fifth embodiment, and an inverter circuit, for example, a full-bridge inverter circuit 260, connected between both terminals of the capacitor 255 of the PFC circuit 250. The full bridge inverter circuit 260 includes a plurality (in this embodiment, four) of switch elements 264$a$, 264$b$, 264$c$, and 264$d$.

The secondary-side circuit 262 includes a plurality (in this embodiment, three) of switch elements 265$a$, 265$b$, and 265$c$.

In this embodiment, the compound semiconductor device according to any one of the first to third embodiments is used as the switch element 251 of the PFC circuit 250 constituting the primary-side circuit 261 and the switch elements 264$a$, 264$b$, 264$c$, and 264$d$ of the full-bridge inverter circuit 260. On the other hand, usual MIS-type FET (field-effect transistor) using silicon is used as the switch elements 265$a$, 265$b$, and 265$c$ of the secondary-side circuit 262.

Seventh Embodiment

Figure 16:
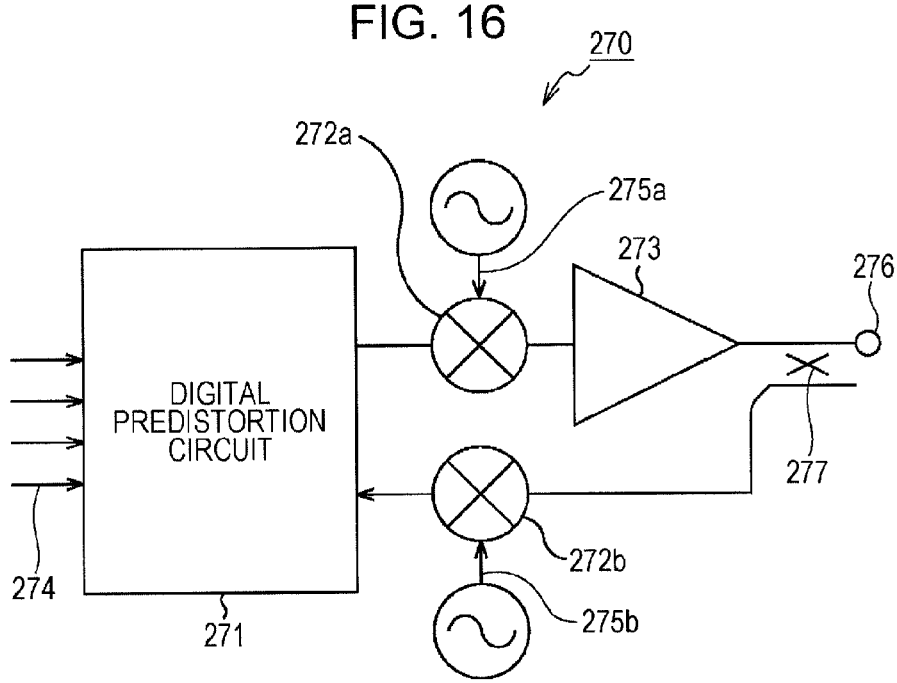
FIG. 16 is a connection diagram illustrating a high-frequency amplifier according to a seventh embodiment.

Next, a seventh embodiment is described. The seventh embodiment relates to a high-frequency amplifier (high-output amplifier) provided with a compound semiconductor device including GaN-based HEMT. FIG. 16 is a connection diagram illustrating a high-frequency amplifier 270 according to the seventh embodiment.

The high-frequency amplifier 270 includes a digital predistortion circuit 271, mixers 272$a$ and 272$b$, and a power amplifier 273.

The digital predistortion circuit 271 compensates an input signal 274 for its nonlinear distortion. The mixer 272$a$ mixes an AC signal 275a and the input signal compensated for nonlinear distortion. The power amplifier 273 includes the compound semiconductor device according to any one of the first to third embodiments in order to amplify the input signal mixed with the AC signal 275a. In this embodiment, for example, a switch 277 may be turned to mix an AC signal 275b and a signal on the output 276 side with the mixer 272b and output the mixed signal to the digital predistortion circuit 271.

The compositions of compound semiconductor layers used in a compound semiconductor laminated structure are not particularly limited, and for example, GaN, AlN, and InN may be used. Also, mixed crystals of these may be used.

In addition, the structures of the gate electrode, the source electrode, and the drain electrode are not limited to those of the above-described embodiments. For example, each of these electrodes may include a single layer. Also, the method for forming the electrodes is not limited to the liftoff method. Further, heat treatment after the source electrode and the drain electrode are formed may be omitted as long as ohmic characteristics are achieved. In addition, heat treatment may be performed for the gate electrode.

In addition, a silicon carbide (SiC) substrate, a sapphire substrate, a silicon substrate, a GaN substrate, or a GaAs substrate may be used as the substrate. The substrate may be conductive, semi-insulating, or insulating. However, in view of cost, a Si substrate (for example, a Si substrate having a (111) plane surface), a SiC substrate, or a sapphire substrate is preferably used. The thickness, material, etc. of each of the layers are not limited to those in the above-described embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
    a substrate;
    a buffer layer formed on the substrate;
    an electron transit layer and an electron donating layer formed on the buffer layer;
    a gate electrode, a source electrode, and a drain electrode formed on the electron donating layer;
    an embedded electrode to which a potential independent of the gate electrode, the source electrode, and the drain electrode is supplied to control a potential of the buffer layer; and
    a Si oxide insulating film that suppresses atomic diffusion from the embedded electrode,
    wherein the Si oxide insulating film entirely covers all surfaces of the embedded electrode.

2. The compound semiconductor device according to claim 1,
    wherein the Si oxide insulating film is formed entirely below a region where a two-dimensional electron gas is produced in the electron transit layer.

3. The compound semiconductor device according to claim 1,
    wherein the embedded electrode is disposed between an upper surface and a lower surface of the buffer layer.

4. The compound semiconductor device according to claim 1,
    wherein the embedded electrode is disposed between an upper surface and a lower surface of the electron transit layer.

5. The compound semiconductor device according to claim 1,
    wherein the embedded electrode includes a conductive compound semiconductor layer.

6. The compound semiconductor device according to claim 1,
    wherein the embedded electrode includes a metal layer.

7. The compound semiconductor device according to claim 1,
    wherein a portion of the embedded electrode is used as an external terminal.

8. A high-output amplifier comprising:
    a compound semiconductor device that includes
    a substrate;
    a buffer layer formed on the substrate;
    an electron transit layer and an electron donating layer formed on the buffer layer;
    a gate electrode, a source electrode, and a drain electrode formed on the electron donating layer;
    an embedded electrode to which a potential independent of the gate electrode, the source electrode, and the drain electrode is supplied to control a potential of the buffer layer; and
    a Si oxide insulating film that suppresses atomic diffusion from the embedded electrode,
    wherein the Si oxide insulating film entirely covers all surfaces of the embedded electrode.

9. A method for manufacturing a compound semiconductor device, the method comprising:
    forming a buffer layer on a substrate;
    forming an electron transit layer and an electron donating layer on the buffer layer;
    forming a gate electrode, a source electrode, and a drain electrode on the electron donating layer;
    forming an embedded electrode to which a potential independent of the gate electrode, the source electrode, and the drain electrode is supplied to control a potential of the buffer layer;
    forming a Si oxide insulating film that suppresses atomic diffusion from the embedded electrode,
    wherein the Si oxide insulating film entirely covers all surfaces of the embedded electrode.

10. The method according to claim 9,
    wherein the Si oxide insulating film is formed entirely below a region where a two-dimensional electron gas is produced in the electron transit layer.

11. The method according to claim 9,
    wherein the embedded electrode is disposed between an upper surface and a lower surface of the buffer layer.

12. The method according to claim 9,
    wherein the embedded electrode is disposed between an upper surface and a lower surface of the electron transit layer.

13. The method according to claim 9,
    wherein the embedded electrode includes a conductive compound semiconductor layer.

14. The method according to claim 9,
    wherein the embedded electrode includes a metal layer.

* * * * *